United States Patent
Lai et al.

(10) Patent No.: US 7,525,799 B2
(45) Date of Patent: Apr. 28, 2009

(54) CABINET FOR ELECTRONIC DEVICES

(75) Inventors: Hsiu-Chang Lai, Taipei Hsien (TW); Ke Sun, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/770,755

(22) Filed: Jun. 29, 2007

(65) Prior Publication Data

US 2008/0151496 A1   Jun. 26, 2008

(30) Foreign Application Priority Data

Dec. 22, 2006   (CN) .......................... 2006 1 0201371

(51) Int. Cl.
*H05K 7/20*   (2006.01)
(52) U.S. Cl. .......................... 361/695; 361/696; 454/184
(58) Field of Classification Search ................. 361/679, 361/687, 688, 690–697, 719–727; 165/80.2, 165/80.3, 104.33, 121–127, 185; 454/185, 454/195; 312/36, 213, 223.2, 236
See application file for complete search history.

(56) References Cited

U.S. PATENT DOCUMENTS

| | | | |
|---|---|---|---|
| 6,494,050 B2 * | 12/2002 | Spinazzola et al. | 62/89 |
| 6,742,583 B2 * | 6/2004 | Tikka | 165/291 |
| 7,236,362 B2 * | 6/2007 | Wang et al. | 361/695 |
| 7,245,485 B1 * | 7/2007 | Morrell | 361/687 |
| 7,254,022 B2 * | 8/2007 | Ebermann | 361/696 |
| 7,255,640 B2 * | 8/2007 | Aldag et al. | 454/184 |

FOREIGN PATENT DOCUMENTS

GB   2 354 066 A   *   3/2001

* cited by examiner

*Primary Examiner*—Michael V Datskovskiy
(74) *Attorney, Agent, or Firm*—Frank R. Niranjan

(57) ABSTRACT

A cabinet includes a front panel, a rear panel defining a plurality of vent ports, and a top wall defining a plurality of apertures therein adjacent to the front panel. A rack having a plurality of shelves is mounted in the cabinet for holding electronic devices. At least one intake fan is installed on a top portion of the cabinet below the apertures of the top wall, and at least one exhaust fan installed on a bottom portion of the cabinet adjacent to the rear panel. The intake fan directs airflow downward into the cabinet for cooling the electronic devices. The exhaust fan directs airflow heated-exchanged with the electronic devices out of the cabinet via the vent ports of the rear panel.

17 Claims, 3 Drawing Sheets

CABINET FOR ELECTRONIC DEVICES

BACKGROUND OF THE INVENTION

1. Field of the Invention

The present invention relates to cabinets for electronic devices, and more particularly to a cabinet having a cooling system for electronic devices.

2. Description of related art

Electronic devices, such as servers, are frequently housed in modular form in a standardized enclosure, and are generally rack-mounted in a cabinet. In order to dissipate the heat produced by the electronic devices, the devices are equipped with at least one fan, and air inlet and outlet ports are defined in a front or a back wall of the enclosure. A plurality of vent openings is defined in a front door of the cabinet, and a plurality of fans is installed in a middle portion of a top wall of the cabinet for drawing heated air produced by the electronic devices out. However, because the fans are installed in the top of the cabinet, and the electronic devices are rack-mounted below the fans, the heated air produced by lower positioned electronic devices is blocked by higher positioned electronic devices, and the heated air is difficult to be drawn out.

What is needed, therefore, is a cabinet having an effective cooling system for electronic devices.

SUMMARY OF THE INVENTION

An exemplary cabinet includes a front panel, a rear panel defining a plurality of vent ports, and a top wall defining a plurality of apertures therein adjacent to the front panel. A rack having a plurality of shelves is mounted in the cabinet for holding electronic devices. At least one intake fan is installed on a top portion of the cabinet below the apertures of the top wall, and at least one exhaust fan installed on a bottom portion of the cabinet adjacent to the rear panel. The intake fan directs airflow downward into the cabinet for cooling the electronic devices. The exhaust fan directs airflow heated-exchanged with the electronic devices out of the cabinet via the vent ports of the rear panel.

Other advantages and novel features will become more apparent from the following detailed description of preferred embodiment when taken in conjunction with the accompanying drawings, in which:

DETAILED DESCRIPTION OF THE INVENTION

Figure 1:
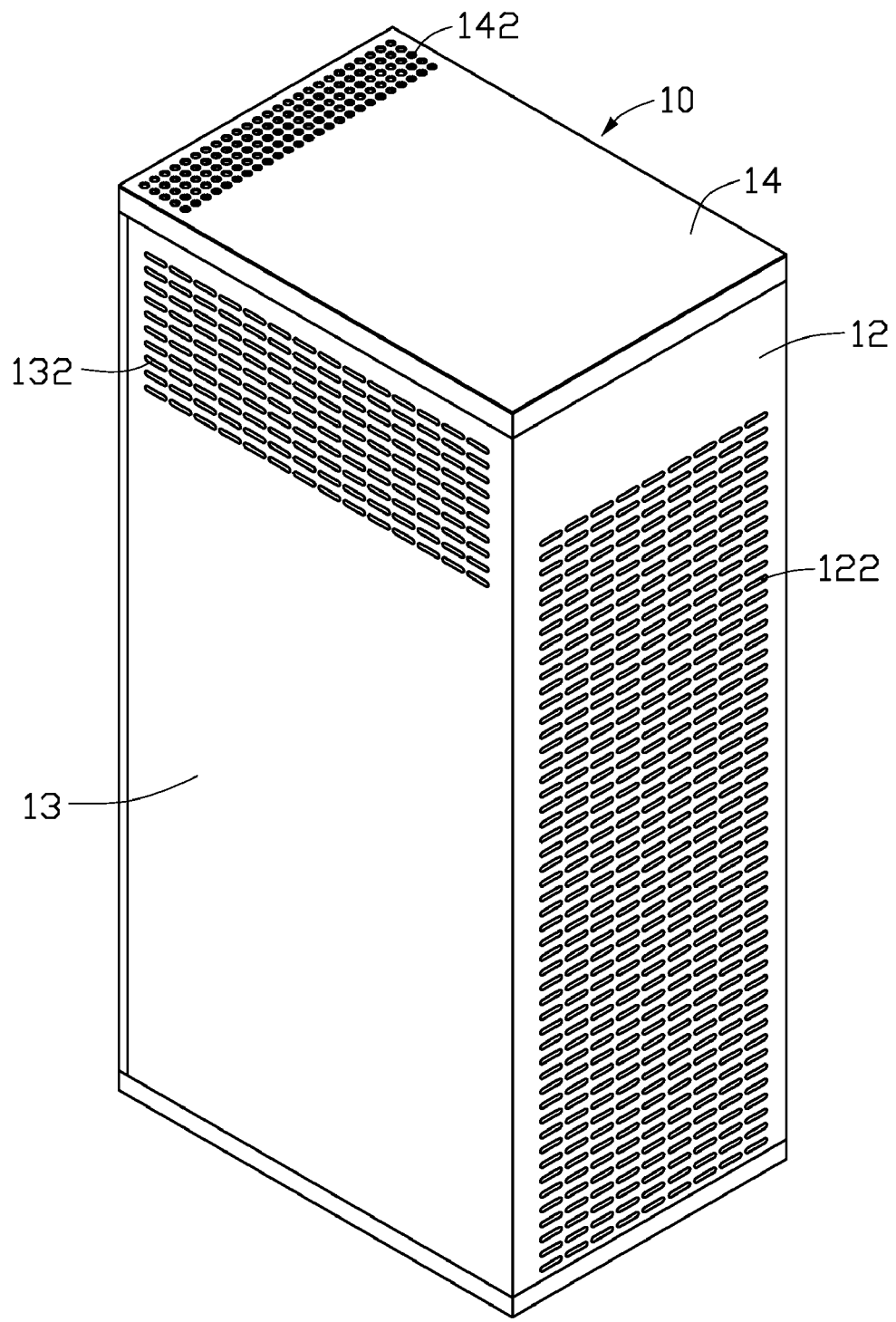
FIG. 1 is an isometric view of a cabinet for electronic devices in accordance with a preferred embodiment of the present invention.
Figure 2:
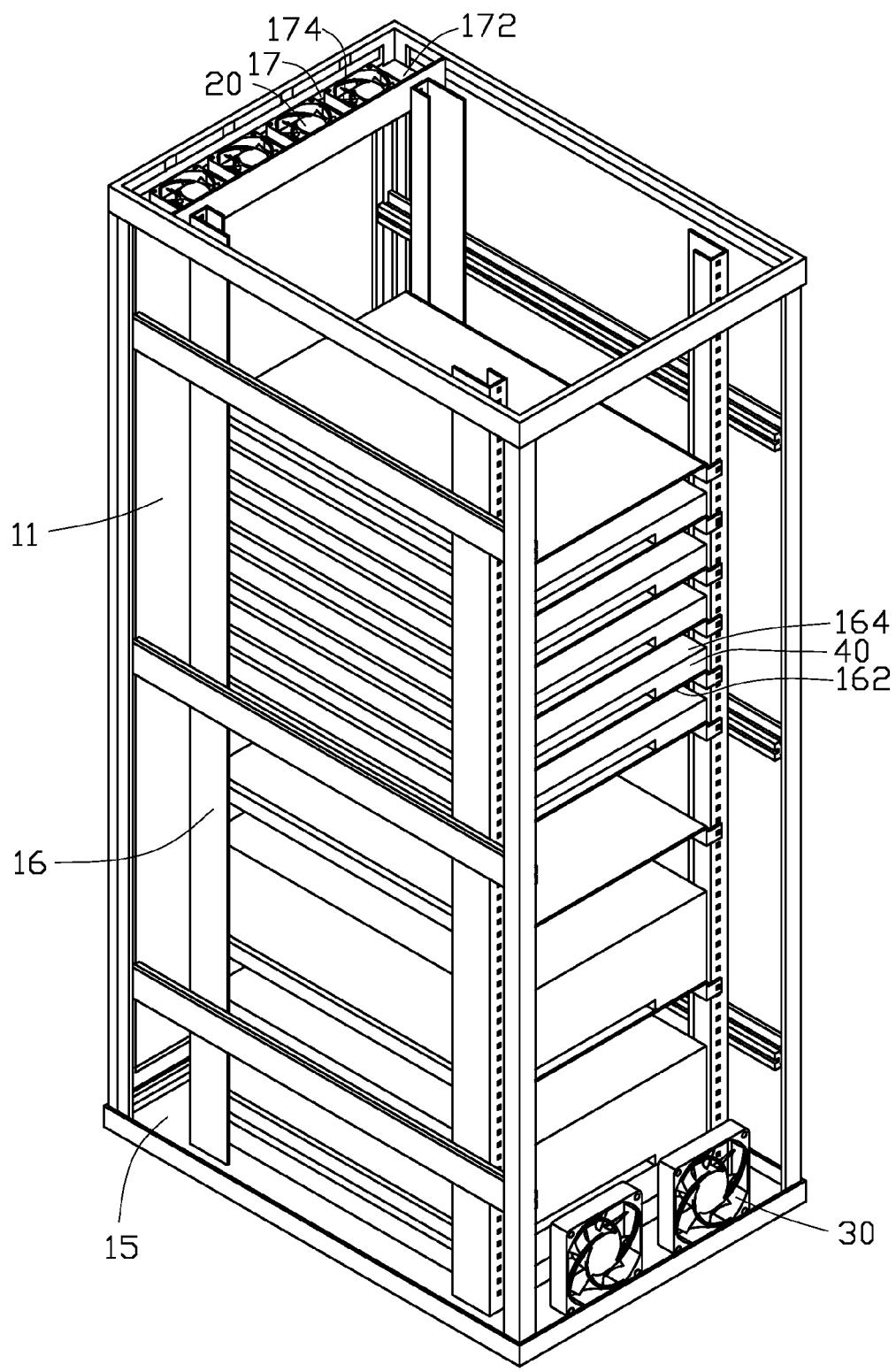
FIG. 2 is similar to FIG. 1, with all surrounding walls removed therefrom except a front panel and a bottom wall.

Referring to FIGS. 1 and 2, a cabinet 10 for a plurality of electronic devices is provided in accordance with an embodiment of the present invention. The cabinet 10 includes a rack 16 installed therein, four intake fans 20, such as air curtain fans, and two exhaust fans 30. In this embodiment, the cabinet 10 is a server cabinet, and the electronic devices are servers 40.

The cabinet 10 is box-shaped. The cabinet 10 includes a front panel 11 pivotably connected therewith, a rear panel 12 defining a plurality of vent ports 122 therein, two sidewalls 13 defining a plurality of vent ports 132 in upper portions thereof, a top wall 14, and a bottom wall 15. A plurality of apertures 142 is defined in the top wall 14 adjacent to the front panel 11. A concave mounting portion 17 is formed on a top portion of the cabinet 10 below the apertures 142 of the top wall 14. A mounting plate 172 is formed on a bottom section of the mounting portion 17. The intake fans 20 are installed in the mounting portion 17 horizontally, for supplying air from up to down. Four openings 174 are defined in the mounting plate 172 below the intake fans 20 respectively, for allowing air therethrough. The exhaust fans 30 are vertically installed on the bottom wall 15 of the cabinet 10, adjacent to the rear panel 12 and aligning with the vent ports 122 of a lower portion of the rear panel 12.

The rack 16 forms a plurality of stacked shelves 162, and the servers 40 are disposed on the shelves 162 respectively. Each of the servers 40 defines a plurality of vent holes in a front wall and a rear wall thereof, and at least one fan is installed in each of the servers 40. An interspace 164 is formed between each server 40 and a corresponding shelf 162 which is right above the server 40.

Figure 3:
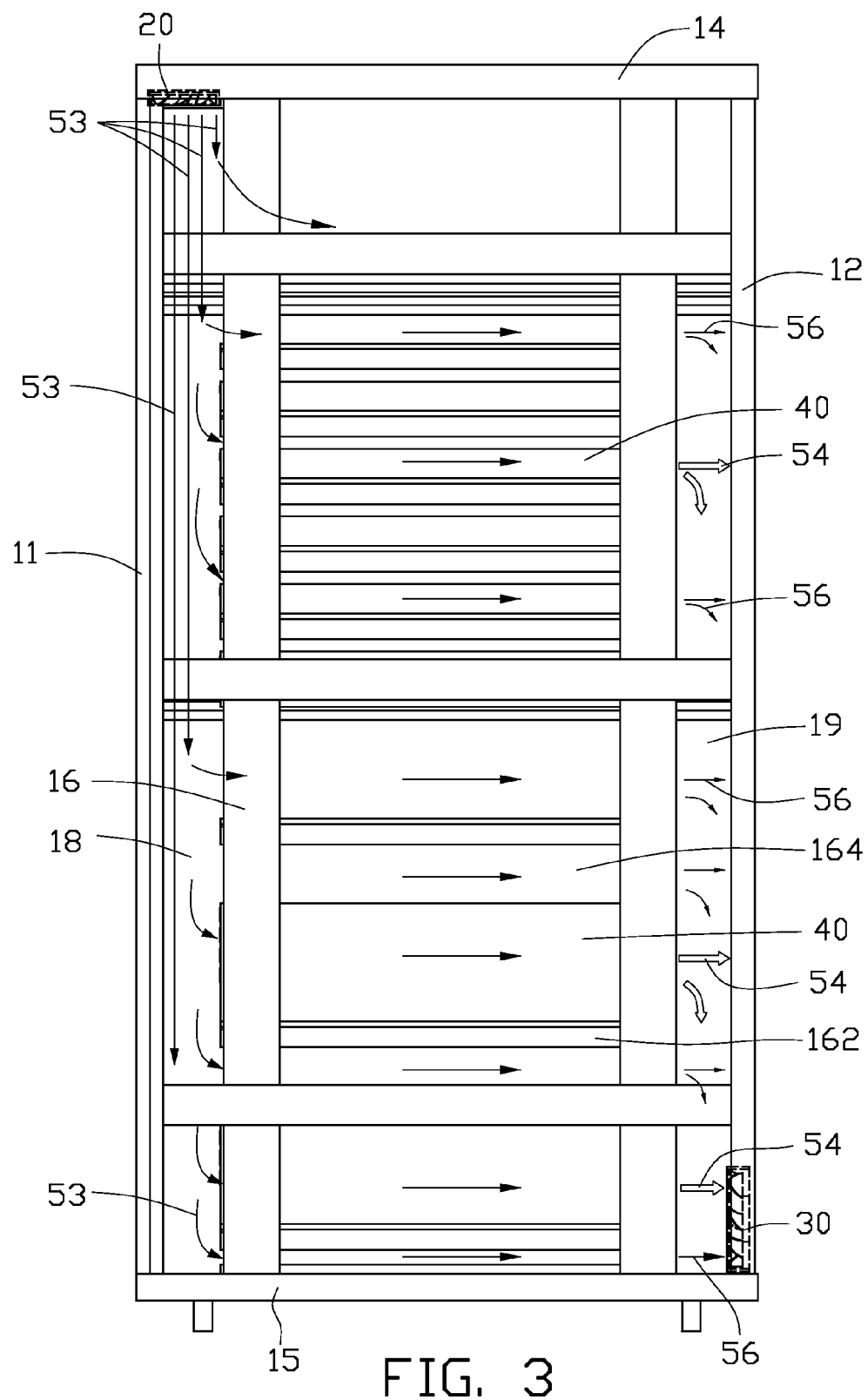
FIG. 3 is side elevational view of FIG. 2, illustrating flow direction of air in the cabinet.

Referring also to FIG. 3, an air inlet channel 18 is formed in the cabinet 10 below the intake fans 20, and between the front panel 11 and the rack 16. An air outlet channel 19 is formed in the cabinet 10 between the rear panel 12 and the rack 16.

When the servers 40 in the cabinet 10 are operating, heat is generated. The intake fans 20 in the top portion of the cabinet 10 draw air from outside through the apertures 142 of the top wall 14, and send airflow 53 downward into the air inlet channel 18. By action of the fans in the servers 40, one part of the airflow 53 is drawn into the servers 40 through the vent holes of the front walls thereof, to cool the servers 40. After the part of the airflow 53 passes through the servers 40, it becomes heated air 54 by heat exchange in the servers 40, and is discharged into the air outlet channel 19 through the vent holes of the rear walls of the servers 40. One part of the heated air 54 in the air outlet channel 19 is directly discharged outside through the vent ports 122 of the rear panel 12 of the cabinet 10, and the other part of the heated air 54 in the air outlet channel 19 is drawn out through the exhaust fans 30 at the bottom of the cabinet 10. The remaining airflow 53 in the air inlet channel 18 is blown into the interspaces 164 between the servers 40 and the corresponding shelves 162, to cool top portions of the servers 40, becomes hot air 56 after heat exchange with the servers 40, and then is blown into the air outlet channel 19. One part of the hot air 56 in the air outlet channel 19 is directly discharged outside through the vent ports 122 of the rear panel 12 of the cabinet 10, and the remaining hot air 56 in the air outlet channel 19 is drawn out through the exhaust fans 30 at the bottom of the cabinet 10.

In the cabinet 10, the intake fans 20, the exhaust fans 30, and the rack 16 together with the servers 40 cooperate to form an unhindered airflow and an effective cooling system. Airflow 53 created by the intake fans 20 flows from up to down, and from front to back in the cabinet 10, to cool the servers 40 installed on the rack 16, and heated air 54 and hot air 56 in the cabinet 10 generated by the servers 40 is effectively expelled through the vent ports 122, 132 assisted by the exhaust fans 30.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A cabinet for electronic devices, the cabinet comprising:
a front panel, a rear panel defining a plurality of vent ports, and a top wall defining a plurality of apertures therein adjacent to the front panel;
a rack having a plurality of shelves for holding the electronic devices respectively;
at least one intake fan installed on a top portion of the cabinet below the apertures of the top wall configured for directing airflow downward into the cabinet for cooling the electronic devices; and
at least one exhaust fan installed on a bottom portion of the cabinet adjacent to the rear panel, for directing airflow heat-exchanged with the electronic devices out of the cabinet via the vent ports of the rear panel.

2. The cabinet as claimed in claim 1, wherein a concave mounting portion is formed on the top portion of the cabinet below the apertures of the top wall, the at least one intake fan is installed in the mounting portion horizontally.

3. The cabinet as claimed in claim 2, wherein a mounting plate is formed on a bottom section of the mounting portion, at least one opening is defined in the mounting plate below the corresponding intake fan, the intake fan draws air into the cabinet through the opening.

4. The cabinet as claimed in claim 1, further comprising a bottom wall, the exhaust fan is vertically installed on the bottom wall aligning with the vent ports of the rear panel.

5. The cabinet as claimed in claim 1, wherein an air inlet channel is formed in the cabinet below the at least one intake fan and between the front panel and the rack, the airflow is directed by the at least one intake fan downward into the air inlet channel and then rearward toward the rack and the electronic devices.

6. The cabinet as claimed in claim 1, wherein an air outlet channel is formed in the cabinet between the rear panel and the rack, through which the exhaust fan draws the airflow heat-exchanged with the electronic devices toward the vent ports of the rear panel.

7. The cabinet as claimed in claim 1, wherein the intake fan is an air curtain fan.

8. A cabinet for electronic devices, the cabinet comprising:
a first wall, and a second wall opposite to the first wall;
a rack retained between the first and second walls configured for retaining the electronic devices spacedly from up to down therein;
a vertical air inlet channel defined between the rack and the first wall of the cabinet and parallel to the first wall;
an air outlet channel parallel to the air inlet channel between the rack and the second wall of the cabinet;
at least one intake device installed on a top portion of the air inlet channel to direct airflow downward into the air inlet channel; and
at least one exhaust device installed on a bottom portion of the air outlet channel, for drawing the airflow in the air inlet channel toward the rack to cool the electronic devices and directing the airflow heat-exchanged with the electronic devices to the air outlet channel and then out of the cabinet.

9. The cabinet as claimed in claim 8, wherein a mounting portion is formed on the top portion of the air inlet channel, the intake device comprises a plurality of axial fans installed in the mounting portion horizontally.

10. The cabinet as claimed in claim 9, wherein a mounting plate is formed on a bottom section of the mounting portion, at least one opening is defined in the mounting plate below the corresponding intake device, the intake fan draws the airflow into the air inlet channel through the opening.

11. The cabinet as claimed in claim 8, wherein the exhaust fan is an axial fan vertically installed on the bottom portion of the air outlet channel.

12. The cabinet as claimed in claim 8, further comprising a top wall defining a plurality of apertures therein above the air inlet channel.

13. The cabinet as claimed in claim 8, wherein the second sidewall of the cabinet defines a plurality of vent ports.

14. A cabinet mounting electronic devices thereon, comprising:
a first wall, and a second wall spaced from and parallel to the first wall;
a rack retained between the first and second walls, the rack comprising a plurality of stacked spaced shelves configured for retaining the electronic devices thereon in a direction perpendicular to the first and second walls, a plurality of interspaces being formed between the electronic device, and adjacent shelves, each of the electronic devices having an internal airflow channel defined therein;
an air inlet channel parallel to the first wall being defined between the rack and the first wall of the cabinet;
an air outlet channel parallel to the air inlet channel being defined between the rack and the second wall of the cabinet, the air outlet channel communicating with the air inlet channel via the interspaces and the internal airflow channels of the electronic devices;
at least one intake device installed at the air inlet channel adjacent to an end of the rack, configured for directing airflow into the air inlet channel; and
at least one exhaust device installed at the air outlet channel adjacent to an opposite end of the rack, configured for drawing one portion of the airflow in the air inlet channel flowing through the interspaces and the internal airflow channels of the electronic devices and out of the cabinet via the air out channel after heat-exchanging with the electronic devices;
wherein the second wall defines a plurality of vent ports configured for one portion of the airflow exiting therethrough after heat-exchanging with the electronic devices.

15. The cabinet as claimed in claim 14, wherein the at least one exhaust device comprises a plurality of exhaust fans installed at one end of the second wall and facing some of the vent ports.

16. The cabinet as claimed in claim 14, further comprising a third wall perpendicularly connected between the first and second walls, wherein the third wall defines a plurality of vent ports, and the at least one intake device comprises a plurality of intake fans installed below and facing the vent ports.

17. The cabinet as claimed in claim 14, wherein the shelves are perpendicular to the first and second walls such that the electronic equipment are installed to the rack in a direction perpendicular to the first and second walls.

* * * * *